(12) United States Patent
Camporeale et al.

(10) Patent No.: US 6,241,200 B1
(45) Date of Patent: Jun. 5, 2001

(54) ELECTROMAGNETIC INTERFERENCE GROUPING CLAMP

(75) Inventors: Savino Camporeale, Spotswood; Mark E. Feiner, Hackettstown; Sebastian J. Messina, Fredon; Nancy S. Rush, Broadway, all of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/302,361

(22) Filed: Apr. 30, 1999

(51) Int. Cl.[7] ........................................... F16L 3/10
(52) U.S. Cl. .................................. 248/68.1; 248/74.4
(58) Field of Search ........................ 248/68.1, 74.1, 248/74.4, 62, 63, 67.5, 74.5; 24/459, 514

(56) References Cited

U.S. PATENT DOCUMENTS

| | | | |
|---|---|---|---|
| 458,964 | * | 9/1891 | Ball ...................................... 248/67.5 |
| 3,233,850 | * | 2/1966 | Merker et al. ....................... 248/68.1 |
| 3,246,076 | * | 4/1966 | Stoneburner ......................... 248/68.1 |
| 4,231,421 | * | 11/1980 | Eaton et al. ......................... 248/68.1 |
| 4,260,848 | * | 4/1981 | Amaya ................................. 174/41 |
| 4,372,510 | * | 2/1983 | Skypala ............................... 248/68.1 |
| 4,431,152 | * | 2/1984 | Reed, Jr. ............................. 248/68.1 |
| 4,799,641 | * | 1/1989 | Koreski ............................... 248/68.1 |
| 5,060,810 | * | 10/1991 | Jones ................................... 248/68.1 |
| 5,234,185 | * | 8/1993 | Hoffman et al. ..................... 248/68.1 |
| 5,389,082 | * | 2/1995 | Baugues et al. ..................... 248/68.1 |
| 5,613,655 | * | 3/1997 | Marion ................................. 248/68.1 |
| 5,992,802 | * | 11/1999 | Campbelll ........................... 248/68.1 |
| 5,996,945 | * | 12/1999 | Coles et al. ......................... 248/68.1 |

* cited by examiner

Primary Examiner—Ramon O. Ramirez
Assistant Examiner—Jon Szumny

(57) ABSTRACT

A grounding clamp includes mechanical features for electrically interconnecting two or more shielding layers of shielded cables, and/or for interconnecting the shielding layer of one or more shielded cables to an electrically grounded chassis. The grounding clamp includes two elongated brackets, each having a first end and a second end, and each being formed of an electrically conductive material. The two brackets include undulating surfaces, and are interconnected to each other at their first ends by a tab and slot arrangement. When the two brackets face each other the undulations on their undulating surfaces are offset relative to one another. The second ends of the brackets are connected by a threaded fastener arrangement, so that cables may be pinched between the undulating surfaces to establish electrical conductivity between shielding layers of the cables and the grounding clamp. One of the two brackets may also include fastening features allowing the grounding clamp to be physically and electrically connected to a grounded chassis.

14 Claims, 4 Drawing Sheets

ELECTROMAGNETIC INTERFERENCE GROUPING CLAMP

BACKGROUND OF THE INVENTION

1. Field of the Invention

The present invention relates to a clamp for holding one or more transmission cables.

2. Description of the Background Art

FIGS. 1 and 2 illustrate a grounding clamp 1, in accordance with the background art. The grounding clamp 1 physically and electrically interacts with a plurality of shielded cables 2 and an electrically grounded chassis 3 of a piece of electrical equipment. The purpose of the grounding clamp 1 is to equate the ground levels of the shielded cables 2 to the ground level of the grounded chassis 3, in order to reduce the likelihood of electrical noise. The grounding clamp 1 also serves to provide strain relief to electrical connections made between the conductors 4, within the shielded cables 2, and terminals, within the electrical equipment. Further, the grounding clamp 1 acts to organize the shielded cables 2, so that the shielded cables 2 are directed in a set direction and are not free to move about.

The physical and electrical interaction of the grounding clamp 1 and the grounded chassis 3 will now be described. The grounding clamp 1 is in the form of a hose clamp, having an engagement ring 5, and being constructed of an electrically conductive material. A hole is drilled in the engagement ring 5 and a threaded fastener 6 is passed through the hole. The threaded fastener 6 is screwed into the grounded chassis 3 thereby establishing electrical conductivity between the grounding clamp 1 and the grounded chassis 3.

The physical and electrical interaction of the grounding clamp 1 and the shielded cables 2 will now be described. An insulation layer 7 is removed from each of the shielded cables 2 to exposes a shielding layer 8. The exposed shielding layers 8 of the shielded cables 2 are aligned so that the hose clamp's engagement ring 5 will overlie the shielding layers 8. The grounding clamp 1 is tightened, via a tightening screw 9, and electrical conductivity is thereby established between the shielding layers 8 and the grounding clamp 1. Therefore, electrical conductivity is also established between the shielding layers 8 and the grounded chassis 3.

The background art's grounding clamp 1 suffers several drawbacks. First, under-tightening of the tightening screw 9 can lead to play between the shielding layers 8 and result in noisy grounding. Conversely, over-tightening of the tightening screw 9 can lead to tearing of one or more of the shielding layers 8 against sharp edges of the grounding clamp 1, such as a head of the threaded fastener 6 or edges of the engagement ring 5. Therefore, it is up to the skill and/or experience of the installer to determine the torque needed, and/or the installer must resort to using a torque wrench.

A second drawback of the background art's hose clamp is that the number of shielded cables 2 to be connected to the grounded chassis 3 can vary between applications. Therefore, if a single hose clamp size is used, it must have an engagement ring 5 of sufficient size to accommodate the maximum number of shielded cables 2. When fewer than the maximum number of shielded cables 2 are installed, the installer must spend assembly time excessively turning the tightening screw 9 to downsize the engagement ring 5 to accommodate the fewer shielded cables 2. Alternatively, a varied supply of hose clamps must be keep on hand by the installer so that the size of the hose clamp can be selected in accordance with the number of shielded cables 2 to be installed.

A third drawback of the background art's hose clamp is its unsightly, unprofessional appearance. The hose clamp literally squeezes all of the shielded cables 2 into a bundle. The shielded cables 2 overlay each other in random disarray. The electrical equipment associated with the grounded chassis 3 can sometimes cost thousands of dollars. A simple hose clamp may not instill confidence in the owners and operators of the costly equipment, that competent and reliable components have been used in the construction of the electrical equipment.

Therefore, there exists a need in the art for a grounding clamp, which automatically applies uniform compression to all of the shielding layers 8 of the shielded cables 2, thus simplifying the installer's responsibilities, and thus protecting the shielding layers 8 from damage. Also, there is a need for a single sized grounding clamp which can accommodate various numbers of shielded cables 2. And further, there exists a need in the art for a grounding clamp which provides a neat and orderly arrangement of the shielded cables 2.

SUMMARY OF THE INVETION

It is an object of the present invention to provide a clamp which solves one or more of the drawbacks of the background art's grounding clamp and which also offers advantages outside the grounding environment.

These and other objects of the present invention are fulfilled by a cable grounding clamp comprising: a first bracket having a first undulating surface having at least one valley for accommodating a shielding layer of a cable; a second bracket having a second undulating surface having at least one peak for engaging the shielding layer; said first undulating surface facing adjacent to said second undulating surface, and at least one of said first undulating surface and said second undulating surface including an electrically conductive material; and at least one detachable connecting device holding said first bracket to said second bracket.

Moreover, these and other objects of the present invention are fulfilled by a transmission cable clamp comprising: a first bracket having a first undulating surface having at least one valley for accommodating a transmission cable; a second bracket having a second undulating surface having at least one peak for engaging the transmission cable; said first undulating surface facing adjacent to said second undulating surface; and at least one detachable connecting device holding said first bracket to said second bracket.

Furthermore, these and other objects of the present invention are fulfilled by a combination comprising: at least one cable having a shielding layer; a first bracket having a first undulating surface having at least one valley accommodating said shielding layer; a second bracket having a second undulating surface having at least one peak engaging said shielding layer; said first undulating surface facing adjacent to said second undulating surface and at least one of said first undulating surface and said second undulating surface including an electrically conductive material; at least one detachable connecting device holding said first bracket to said second bracket; a chassis; and a fastening feature, being a part of said second bracket, to connect said second bracket to said chassis.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIENTS

Figure 1:
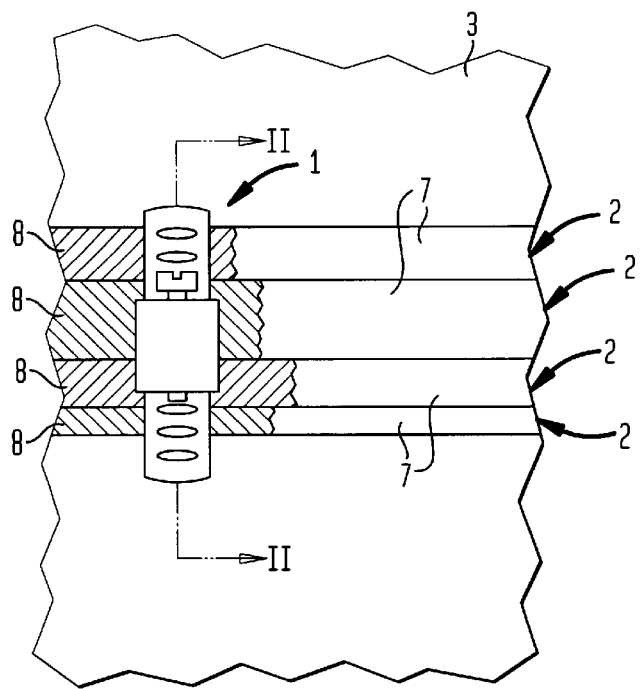
FIG. 1 is a side view of a grounding clamp in accordance with the background art.
Figure 2:
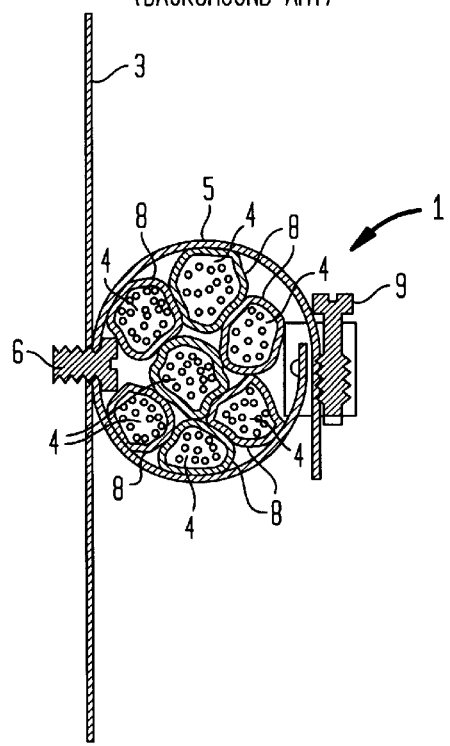
FIG. 2 is a cross sectional view taken along line II—II of FIG. 1.
Figure 3:
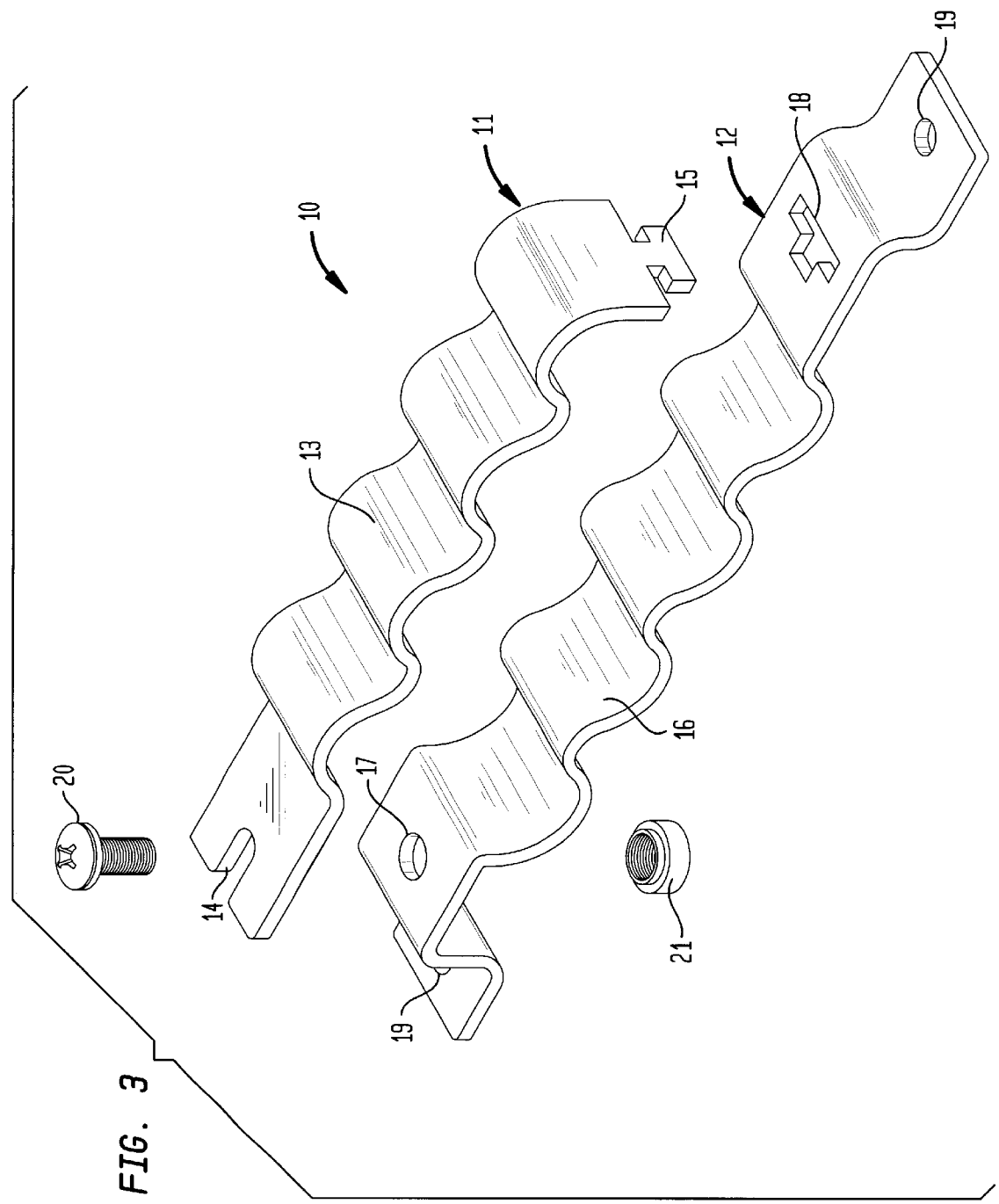
FIG. 3 is a perspective view of a grounding clamp in accordance with the present invention.

In FIG. 3, an improved grounding clamp 10, according to the present invention, includes a first bracket 11 and a second bracket 12 constructed of an electrically conductive material, such as a base metal or alloy. The first bracket 11 is characterized by a first undulating surface 13 having a plurality of sequential peaks and valleys. One end of the first bracket 11 includes a through channel 14, and the other end includes a downwardly oriented locking tab 15. The locking tab 15 is T-shaped.

The second bracket 12 is characterized by a second undulating surface 16 having a plurality of sequential peaks and valleys. One end of the second bracket 12 includes a through hole 17, and the other end includes a locking slot 18. The locking slot 18 is also T-shaped. Both ends of the second bracket 12 also include fastener openings 19.

The first bracket 11 may be loosely attached to the second bracket 12 by inserting the locking tab 15 into the locking slot 18, and slightly moving the first bracket 11 toward the end of the second bracket 12 having the through hole 17. Next, the first bracket 11 may be firmly secured to the second bracket 12 by passing a threaded fastener 20 through the through channel 14 and through hole 17, and engaging/tightening the threaded fastener 20 within a threaded nut, or threaded collar 21. Preferably, the threaded collar 21 is welded, integral, or otherwise secured within or adjacent to the through hole 17, so that the collar 21 need not be held by a tool during tightening of the threaded fastener 20.

Figure 4:
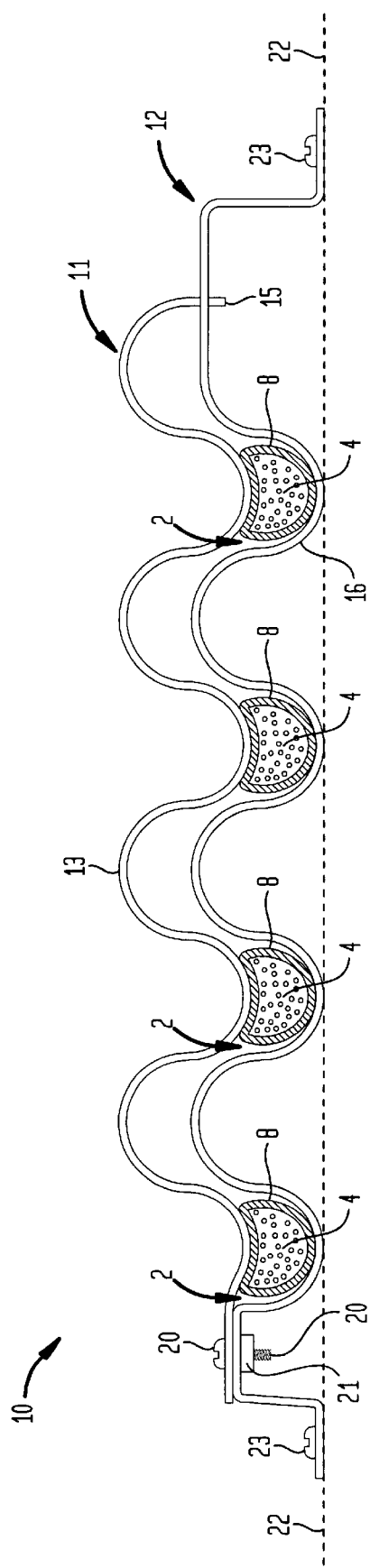
FIG. 4 is a cross sectional view of the grounding clamp accommodating four shielded cables.

FIG. 4 is a cross sectional view illustrating the grounding clamp 10 secured to a grounded chassis 22. The grounding clamp 10 is secured to the grounded chassis 22 by two fasteners 23 which are passed through the fastener openings 19 formed in the ends of the second bracket 12. The fasteners 23 may be sheet metal screws, rivets, nut and bolt arrangements, or any other type of known fasteners. Alternatively, the second bracket 12 could be welded, soldered, or otherwise attached directly to the grounded chassis 22, in which case the second bracket 12 need not have the fastener openings 19. Alternatively, the second bracket 12 could be integrally formed as a part of the grounded chassis 22.

It should be noted that when the first bracket 11 is firmly secured to the second bracket 12, the peaks and valleys of the first undulating surface 13 are offset by approximately one hundred and eighty degrees from the peaks and valleys of the second undulating surface 16. By this arrangement, a plurality of shielded cables 2 can be grounded and locked into the grounding clamp 10 between the overlapped peaks and valleys of the first and second undulating surfaces 13 and 16.

As illustrated in FIG. 4, the shielding layers 8 of the shielded cables 2 are each directly contacted by portions of the grounding clamp 10. The portions of the grounding clamp 10 in contact with the shielding layers 8 are smooth curved surfaces. This results in the advantage that the grounding clamp 10 will not tend to tear or damage the shielding layers 8, as did the background art's hose clamp.

A further advantage of the grounding clamp 10 is that the installer need not be concerned with the precise torque placed upon any tightening screw 9, as in the background art's hose clamp. In the improved grounding clamp 10, the installer simply tightens the threaded fastener 20 to a degree sufficient to prevent later loosening of the threaded fastener 20. The installer need not precisely gauge the torque applied to the threaded fastener 20, since the first bracket 11 is intended to fully seat against the second bracket 12.

The degree of curvature of the first and second undulating surfaces 13, 16 sets the compression level under which a given gauge of shielded cable 2 is placed when the first bracket 11 is seated against the second bracket 12. FIG. 4 illustrates a relatively large degree of curvature which is suitable for shielded cables 2 of a smaller diameter. If larger diameter shielded cables 2 are to be grounded and locked into place, the degree of curvature of one or both of the first and second undulating surfaces 13, 16 should be reduced, thereby affording more space between the peaks and correspondingly aligned valleys of the first and second undulating surfaces 13, 16.

Figure 5:
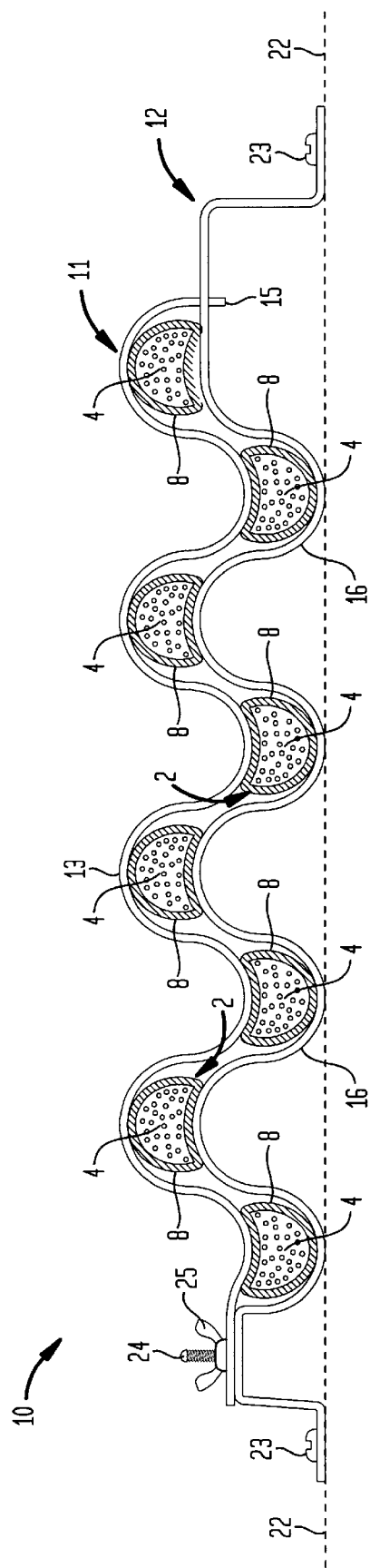
FIG. 5 is cross sectional view of the grounding clamp accommodating eight shielded cables, and illustrating a wing nut locking device.

FIG. 5 illustrates the grounding clamp 10 being used to ground and lock into place eight shielded cables 2. It should be noted that the eight shielded cables 2 would be neatly spaced and arranged parallel to one another. This arrangement is quite professional and orderly and can assist the installer and operator of the electrical equipment in distinguishing a given shielded cable 2 from surrounding shielded cables 2 when servicing or trouble-shooting the electrical equipment and/or shielded cables 2.

Also, of interest in FIG. 5 is the alternative form of firmly securing the first bracket 11 to the second bracket 12. The second bracket 12 includes an upstanding, threaded member 24 fixed to its end. The upstanding threaded member 24 replaces the through hole 17 and threaded collar 21, illustrated in FIGS. 3 and 4. The threaded member 24 is sized to pass through the through channel 14 formed in the end of the first bracket 11. A wing nut 25 is threadably engaged to the threaded member 24. Tightening the wing nut 25 firmly secures the first bracket 11 to the second bracket 12.

Various departures and modifications can be made to the present invention without departing from the spirit and scope of the accompanying claims. For instance, the cross sectional shapes of the first and second undulating surfaces 13, 16 (FIGS. 4 and 5) can have more or less complex shapes than the illustrated smoothly curved wave. The locking tab 15 and locking slot 18 have been illustrated as having T-shapes. It would be possible to modify their shapes. For instance, the locking tab 15 and locking slot 18 could have L-shapes. Further, the locking tab 15 and locking slot 18 could be replaced by other forms of attachment, such as by a second threaded fastener 20 and a second threaded collar 21, if a more secure attachment is desired between the first and second brackets 11, 12.

The first and second brackets 11, 12 need not be completely formed of conductive materials. It would be possible to simply plate the brackets 11, 12 with a conductive layer. Further, it would be possible to print a conductive layer onto those portions, of one or both of the first and second brackets 11, 12, which contact with the shielding layers 8. The printed conductive layer would be continuous to, and in contact with, the grounded chassis 22. As a further alternative, the grounding clamp 10 need not be attached to the grounded chassis 22. Occasionally, it is important to simply establish a common ground amongst shielded cables 2 at a location remote from any grounded chassis 22.

The grounding clamp 10 could also be partially or completely formed of nonconductive materials. In this embodiment, the present invention would simply be a clamp instead of a grounding clamp. The cables 2 would not have their insulation layers 7 removed therefrom before being passed through the clamp. In this embodiment, the clamp would be used to provide neat and orderly alignment of cables at and near the clamp. In other words, the clamp would be a cable guide.

Although the drawings have illustrated shielded electrical cables 2 having a plurality of inner, individually insulated communication wires 4, it should be appreciated that the present invention would also be applicable to other types of transmission cables, such as fiber optic cables or power transmission cables.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. A combination for grounding a shielding layer of a cable, said combination comprising:
    a first bracket having a first undulating surface having at least one valley for accommodating the shielding layer;
    a second bracket having a second undulating surface having at least one peak adapted to engage the shielding layer;
    said first undulating surface facing adjacent to said second undulating surface, and at least one of said first undulating surface and said second undulating surface including an electrically conductive material for engaging the shielding layer;
    at least one detachable connecting device holding said first bracket to said second bracket, such that said at least one peak overlays said at least one valley for sandwiching the cable therebetween;
    a grounded chassis; and
    a fastening feature connecting at least one of said first and second brackets to said grounded chassis, wherein at least one of said first and second brackets is adapted to establish electrical conductivity between the shielding layer of the cable and said grounded chassis.

2. The combination according to claim 1, wherein said at least one detachable connecting device includes a threaded member formed on one of said first bracket and said second bracket and a through hole or channel for allowing said threaded member to pass therethrough formed in the other of said first bracket and said second bracket.

3. The combination according to claim 2, further comprising a wing nut for mating with said threaded member.

4. The combination according to claim 1, wherein said at least one detachable connecting device includes a tab formed on one of said first bracket and said second bracket and a slot for holding said tab formed in the other of said first bracket and said second bracket.

5. The combination according to claim 4, wherein said at least one detachable connecting device further includes a threaded member formed on one of said first bracket and said second bracket, and a through hole or channel for allowing said threaded member to pass therethrough formed in the other of said first bracket and said second bracket.

6. The combination according to claim 5, further comprising a wing nut for mating with said threaded member.

7. The combination according to claim 1, wherein said at least one detachable connecting device includes a threaded hole formed on one of said first bracket and said second bracket, and a through hole or channel, for overlaying said threaded hole, formed in the other of said first bracket and said second bracket.

8. The combination according to claim 7, further comprising a threaded member for passing through said through hole or channel, and for mating with said threaded hole.

9. The combination according to claim 1, wherein said at least one valley of said first undulating surface includes four valleys, and said first undulating surface further includes four peaks; and wherein said at least one peak of said second undulating surface includes four peaks, and said second undulating surface further includes four valleys, so that said combination can accommodate up to eight cables.

10. The combination according to claim 1, wherein said second bracket is formed of an electrically conductive material.

11. The combination according to claim 10, wherein said first bracket is formed of an electrically conductive material.

12. The combination according to claim 1, wherein said at least one fastening feature includes a through hole or channel formed in said second bracket for receiving a fastener therethrough.

13. A combination comprising:
    at least one cable having a shielding layer;
    a first bracket having a first undulating surface having at least one valley accommodating said shielding layer;
    a second bracket having a second undulating surface having at least one peak engaging said shielding layer;
    said first undulating surface facing adjacent to said second undulating surface and at least one of said first undulating surface and said second undulating surface including an electrically conductive material engaging said shielding layer;
    at least one detachable connecting device holding said first bracket to said second bracket, such that said at least one peak overlays said at least one valley sandwiching said at least one cable therebetween;
    a grounded chassis; and
    a fastening feature connecting at least one of said first and second brackets to said grounded chassis, wherein at least one of said first and said second brackets establishes electrical conductivity between said shielding layer of said at least one electrical cable and said grounded chassis.

14. The combination according to claim 13, wherein said fastening feature includes two openings formed in said second bracket for allowing shafts of two fasteners to pass therethrough.

* * * * *